(12) United States Patent
Zuo et al.

(10) Patent No.: US 9,322,268 B2
(45) Date of Patent: Apr. 26, 2016

(54) METHODS FOR RESERVOIR EVALUATION EMPLOYING NON-EQUILIBRIUM COMPOSITIONAL GRADIENTS

(75) Inventors: Youxiang Zuo, Sugar Land, TX (US); Eric Lehne, Edmonton (CA); Saifon Sirimongkolkitti, Nakhonsithammarat (TH); Shu Pan, Edmonton (CA); Oliver C. Mullins, Ridgefield, CT (US)

(73) Assignee: Schlumberger Technology Corporation, Sugar Land, TX (US)

( * ) Notice: Subject to any disclaimer, the term of this patent is extended or adjusted under 35 U.S.C. 154(b) by 536 days.

(21) Appl. No.: 13/876,801

(22) PCT Filed: May 31, 2011

(86) PCT No.: PCT/IB2011/052407
§ 371 (c)(1),
(2), (4) Date: Oct. 1, 2013

(87) PCT Pub. No.: WO2012/042397
PCT Pub. Date: Apr. 5, 2012

(65) Prior Publication Data
US 2014/0200810 A1    Jul. 17, 2014

Related U.S. Application Data

(60) Provisional application No. 61/387,066, filed on Sep. 28, 2010.

(51) Int. Cl.
*E21B 49/08* (2006.01)
*E21B 49/10* (2006.01)
(52) U.S. Cl.
CPC ............. *E21B 49/087* (2013.01); *E21B 49/10* (2013.01); *E21B 49/08* (2013.01); *E21B 2049/085* (2013.01)

(58) Field of Classification Search
USPC .................................. 702/6, 11, 13
See application file for complete search history.

(56) References Cited

U.S. PATENT DOCUMENTS 6,985,841 B2 *   1/2006   Barroux .................... 703/10
7,081,615 B2 *   7/2006   Betancourt et al. ........ 250/255
(Continued)

FOREIGN PATENT DOCUMENTS

WO    2009093105 A1    7/2009
WO    2011007268 A1    1/2011

OTHER PUBLICATIONS

International Search Report for International Application No. PCT/IBS2011/052407 dated Dec. 14, 2012.
(Continued)

*Primary Examiner* — Huan Tran
(74) *Attorney, Agent, or Firm* — Kenneth L. Kincaid

(57) ABSTRACT

A method for determining reservoir architecture using modeling of a non-equilibrium distribution of at least one analyte in reservoir fluids. The analyte(s) of the analysis preferably has (have) significant compositional variation in the reservoir. For example, the analyte can be a later charging single gas component (such as methane, carbon dioxide, or hydrogen sulfide) in a multi-component fluid system. In this case, the model can assume that the components of the early charge are in a stationary state or in equilibrium, whereas the later charge is in a state of non-equilibrium. The non-equilibrium distribution of the analyte(s) derived from the model is compared to the distribution of the analyte(s) derived from downhole or laboratory fluid analysis of reservoir fluid, and the architecture of the reservoir is determined based upon such comparison.

12 Claims, 5 Drawing Sheets

(56) References Cited

U.S. PATENT DOCUMENTS

| | | | |
|---|---|---|---|
| 7,158,887 B2* | 1/2007 | Betancourt et al. | 702/11 |
| 7,526,953 B2* | 5/2009 | Goodwin et al. | 73/152.28 |
| 7,822,554 B2* | 10/2010 | Zuo et al. | 702/6 |
| 7,920,970 B2 | 4/2011 | Zuo et al. | |
| 7,996,154 B2 | 8/2011 | Zuo et al. | |
| 8,996,346 B2* | 3/2015 | Zuo et al. | 703/10 |
| 2004/0104341 A1* | 6/2004 | Betancourt et al. | 250/255 |
| 2007/0119244 A1* | 5/2007 | Goodwin et al. | 73/152.28 |
| 2007/0143023 A1* | 6/2007 | Betancourt et al. | 702/11 |
| 2009/0312997 A1 | 12/2009 | Freed et al. | |
| 2012/0232799 A1 | 9/2012 | Zuo et al. | |
| 2012/0232859 A1* | 9/2012 | Pomerantz et al. | 703/2 |
| 2012/0296617 A1 | 11/2012 | Zuo et al. | |

OTHER PUBLICATIONS

Betancourt et al. "Predicting Downhole Fluid Analysis Logs to Investigate Reservoir Connectivity," International Petroleum Technology Conference, IPTC 11488, Dec. 4, 2007, pp. 1-11, XP002602383.

Zuo et al. "EOS-based downhole fluid characterization," SPE Asia Pacific Oil and Gas Conference and Exhibition 2008—Gas Now: Delivering on Expectations, vol. 1, Oct. 20, 2008, pp. 200-207, XP009133860.

Gibson, et al. "New Methods for the Nonequilibrium Initialisation of Reservoir Models with Lateral and Vertical Variations in the Initial Fluid Composition," SPE 101247, presented at 2006 Abu Dhabi International Petroleum Exhibition and Conference, Abu Dhabi, U.A.E., Nov. 5-8, 2006, pp. 1-9.

Montel, et al. "Initial State of Petroleum Reservoirs: A Comprehensive Approach", J. Petroleum Science & Engineering, 2007, No. 58, pp. 391-402.

* cited by examiner

METHODS FOR RESERVOIR EVALUATION EMPLOYING NON-EQUILIBRIUM COMPOSITIONAL GRADIENTS

CROSS-REFERENCE TO RELATED APPLICATIONS

The present invention claims priority from U.S. Provisional Patent Application 61/387,066, filed on Sep. 28, 2010, which is incorporated herein by reference in its entirety.

BACKGROUND OF THE INVENTION

1. Field of the Invention

The present invention relates to methods for characterizing petroleum fluids extracted from a hydrocarbon-bearing geological formation. The invention has application to reservoir architecture understanding, although it is not limited thereto.

2. Description of Related Art

Petroleum consists of a complex mixture of hydrocarbons of various molecular weights, plus other organic compounds. The exact molecular composition of petroleum varies widely from formation to formation. The proportion of hydrocarbons in the mixture is highly variable and ranges from as much as 97 percent by weight in the lighter oils to as little as 50 percent in the heavier oils and bitumens. The hydrocarbons in petroleum are mostly alkanes (linear or branched), cycloalkanes, aromatic hydrocarbons, or more complicated chemicals like asphaltenes. The other organic compounds in petroleum typically contain carbon dioxide ($CO_2$), nitrogen, oxygen, and sulfur, and trace amounts of metals such as iron, nickel, copper, and vanadium.

Petroleum is usually characterized by SARA fractionation where asphaltenes are removed by precipitation with a paraffinic solvent and the deasphalted oil separated into saturates, aromatics, and resins by chromatographic separation.

Saturates include alkanes and cycloalkanes. The alkanes, also known as paraffins, are saturated hydrocarbons with straight or branched chains which contain only carbon and hydrogen and have the general formula $C_nH_{2n+2}$. They generally have from 5 to 40 carbon atoms per molecule, although trace amounts of shorter or longer molecules may be present in the mixture. The alkanes include methane ($CH_4$), ethane ($C_2H_6$), propane ($C_3H_8$), i-butane ($iC_4H_{10}$), n-butane ($nC_4H_{10}$), i-pentane ($iC_5H_{12}$), n-pentane ($nC_5H_{12}$), hexane ($C_6H_{14}$), heptane ($C_7H_{16}$), octane ($C_8H_{18}$), nonane ($C_9H_{20}$), decane ($C_{10}H_{22}$), hendecane ($C_{11}H_{24}$)—also referred to as endecane or undecane, dodecane ($C_{12}H_{26}$), tridecane ($C_{13}H_{28}$), tetradecane ($C_{14}H_{30}$), pentadecane ($C_{15}H_{32}$) and hexadecane ($C_{16}H_{34}$). The cycloalkanes, also known as napthenes, are saturated hydrocarbons which have one or more carbon rings to which hydrogen atoms are attached according to the formula $C_nH_{2n}$. Cycloalkanes have similar properties to alkanes but have higher boiling points. The cycloalkanes include cyclopropane ($C_3H_6$), cyclobutane ($C_4H_8$), cyclopentane ($C_5H_{10}$), cyclohexane ($C_6H_{12}$), and cycloheptane ($C_7H_{14}$).

The aromatic hydrocarbons are unsaturated hydrocarbons which have one or more planar six-carbon rings called benzene rings, to which hydrogen atoms are attached with the formula $C_nH_n$. They tend to burn with a sooty flame, and many have a sweet aroma. The aromatic hydrocarbons include benzene ($C_6H_6$) and derivatives of benzene, as well as polyaromatic hydrocarbons.

Resins are the most polar and aromatic species present in the deasphalted oil and, it has been suggested, contribute to the enhanced solubility of asphaltenes in crude oil by solvating the polar and aromatic portions of the asphaltenic molecules and aggregates.

Asphaltenes are insoluble in n-alkanes (such as n-pentane or n-heptane) and soluble in toluene. The C:H ratio is approximately 1:1.2, depending on the asphaltene source. Unlike most hydrocarbon constituents, asphaltenes typically contain a few percent of other atoms (called heteroatoms), such as sulfur, nitrogen, oxygen, vanadium, and nickel. Heavy oils and tar sands contain much higher proportions of asphaltenes than do medium-API oils or light oils. Condensates are virtually devoid of asphaltenes. As far as asphaltene structure is concerned, experts agree that some of the carbon and hydrogen atoms are bound in ring-like, aromatic groups, which also contain the heteroatoms Alkane chains and cyclic alkanes contain the rest of the carbon and hydrogen atoms and are linked to the ring groups. Within this framework, asphaltenes exhibit a range of molecular weight and composition. Asphaltenes have been shown to have a distribution of molecular weight in the range of 300 to 1400 g/mol with an average of about 750 g/mol. This is compatible with a molecule contained seven or eight fused aromatic rings, and the range accommodates molecules with four to ten rings. It is also known that asphaltene molecules aggregate to form nanoaggregates and clusters.

Reservoir compartmentalization can be a significant impediment to efficient reservoir development. Reservoir compartmentalization is the natural occurrence of hydraulically isolated pockets within a reservoir. In order to produce a reservoir in an efficient manner, it is necessary to know the structure of the rock and the level of compartmentalization. A reservoir compartment does not produce unless it is tapped by a well. In order to justify the drilling of a well, the reservoir compartment must be sufficiently large to sustain economic production. Furthermore, in order to achieve efficient recovery, it is generally desirable to know the locations of as many of the reservoir compartments as practical before extensive development has been done.

There are three industry standard procedures widely used to understand reservoir compartmentalization. First is the evaluation of petrophysical logs. Petrophysical logs may identify impermeable barriers, and the existence of such barriers can be taken to mean that the reservoir is compartmentalized. Examples include gamma ray and NMR logs, both of which can identify impermeable barriers in favorable situations. Another example is the evaluation of mud filtrate invasion monitored by resistivity logs. However, impermeable barriers may be so thin that they are not observable by these logs, or barriers observed by these logs may not extend away from the wellbore and therefore may not compartmentalize the reservoir. Second is the evaluation of pressure gradients. If two permeable zones are not in pressure communication, they are not in flow communication. However, the presumption that pressure communication implies flow communication has been repeatedly proven to be incorrect. Pressure equilibration requires relatively little fluid flow and can occur more than five times faster than fluid compositional equilibration, even in the presence of flow barriers. Continuous pressure gradients are a necessary but insufficient test for reservoir connectivity. Third is the comparison of geochemical fingerprints of fluid samples acquired from different locations in the reservoir. Petroleum is a complex chemical mixture, containing many different chemical compounds; the composition of that petroleum can therefore be treated as a fingerprint. If the composition of petroleum samples from two different places in the reservoir is the same, it is assumed that fluids can flow readily between those two places in the reservoir, and hence that the reservoir is connected. However, forces such as biodegradation and water washing can occur to different extents in different parts of the reservoir, causing two locations in the reservoir to have different fingerprints even if they are connected. Additionally, petroleum samples generated from the same source rock may have very similar fingerprints even if they come from locations in the reservoir that are presently disconnected.

An alternative method to assess connectivity is to evaluate hydrocarbon fluid compositional grading. The chemical composition of petroleum must be different in different parts of a connected reservoir. This change in composition with position (typically depth) in the reservoir is referred to as compositional grading. The magnitude of this compositional grading (i.e., the difference in the composition of two fluids collected from different depths), in connected reservoirs at thermodynamic equilibrium, can be measured with downhole fluid analysis and predicted with a mathematical equation of state (EOS) model. The EOS model is based on assumptions that the reservoir is connected and at thermodynamic equilibrium. If the magnitude of compositional grading as measured matches the predicted composition grading, then the assumptions of the EOS model are confirmed. In the event that the magnitude of the measured compositional grading does not match the predictions of the EOS model, it can be assumed that there is reservoir compartmentalization or that the reservoir fluids are not in equilibrium. Many different forces can contribute to a lack of thermodynamic equilibrium, such as tar mats, water washing, biodegradation, and real-time charging. It can be difficult to determine whether the reservoir is compartmentalized or in a state of thermodynamic non-equilibrium, and this determination can be critical to important development decisions.

More specifically, there is an increasing awareness that fluids are often heterogeneous in the reservoir and that reservoir fluids frequently demonstrate complicated fluid compositions, properties, and phase behaviors in single oil columns due to a variety of factors including gravity, thermal gradients, biodegradation, active charging, water washing, and phase transitions. Most of these mechanisms result in non-equilibrium or non-stationary state conditions acting on reservoir fluids and, often, these non-equilibrium factors dominate over diffusive and convective processes that can drive the fluids towards equilibrium. In these scenarios, the current modeling methods can be inaccurate and offer limited insight into the real compositional properties of the reservoir fluids. These limitations make it difficult to determine whether the reservoir is compartmentalized or connected, but in a state of non-equilibrium.

Thus, there is a clear need for methodologies that provide for an effective understanding of reservoir fluids, particularly for scenarios where it is difficult to determine whether the reservoir is compartmentalized, or connected but in a state of non-equilibrium.

BRIEF SUMMARY OF THE INVENTION

Therefore, the present invention provides methods that allow for effective understanding of reservoir fluids, particularly for scenarios where it is difficult to determine whether the reservoir is compartmentalized, or connected but in a state of non-equilibrium.

A method is provided for characterizing a hydrocarbon reservoir of interest traversed by a wellbore. A numerical model is used to simulate over time non-equilibrium concentration of at least one hydrocarbon component (analyte) as a function of location within the wellbore. Fluid samples acquired from the wellbore are analyzed to measure concentration of the analyte(s) as a function of location within the wellbore. The simulated non-equilibrium concentration of the analyte(s) as a function of location within the wellbore is compared to the measured concentration of the analyte(s) as a function of location within the wellbore, and the architecture of the reservoir of interest is determined from such comparison.

In one embodiment, the reservoir fluid within the wellbore is determined to be connected and in a state of non-equilibrium in the event that there are small differences between the simulated non-equilibrium concentration of the analyte(s) as a function of location within the wellbore and the measured concentration of the analyte(s) as a function of location within the wellbore.

In another embodiment, the reservoir fluid within the wellbore is determined to be compartmentalized in the event that there are large differences between the simulated non-equilibrium concentration of the analyte(s) as a function of location within the wellbore and the measured concentration of the analyte(s) as a function of location within the wellbore.

In the preferred embodiment, the analyte(s) of the analysis has (have) significant compositional variation in the reservoir. For example, the analyte can be a later charged single gas component (such as methane, carbon dioxide, and hydrogen sulfide) in a multiple component fluid system. In this case, the numerical model can assume that the components in the early charge are in a stationary state or in a state of equilibrium, whereas the later charge is in a state of non-equilibrium.

In one embodiment, downhole fluid analysis over a number of locations in the wellbore is used to measure the concentration of the analyte(s) as a function of location within the wellbore. In another embodiment, laboratory analysis of reservoir fluid acquired from a number of locations in the wellbore is used to measure the concentration of the analyte(s) as a function of location within the wellbore.

Additional advantages of the invention will become apparent to those skilled in the art upon reference to the detailed description taken in conjunction with the provided figures.

DETAILED DESCRIPTION OF THE INVENTION

Figure 1A:
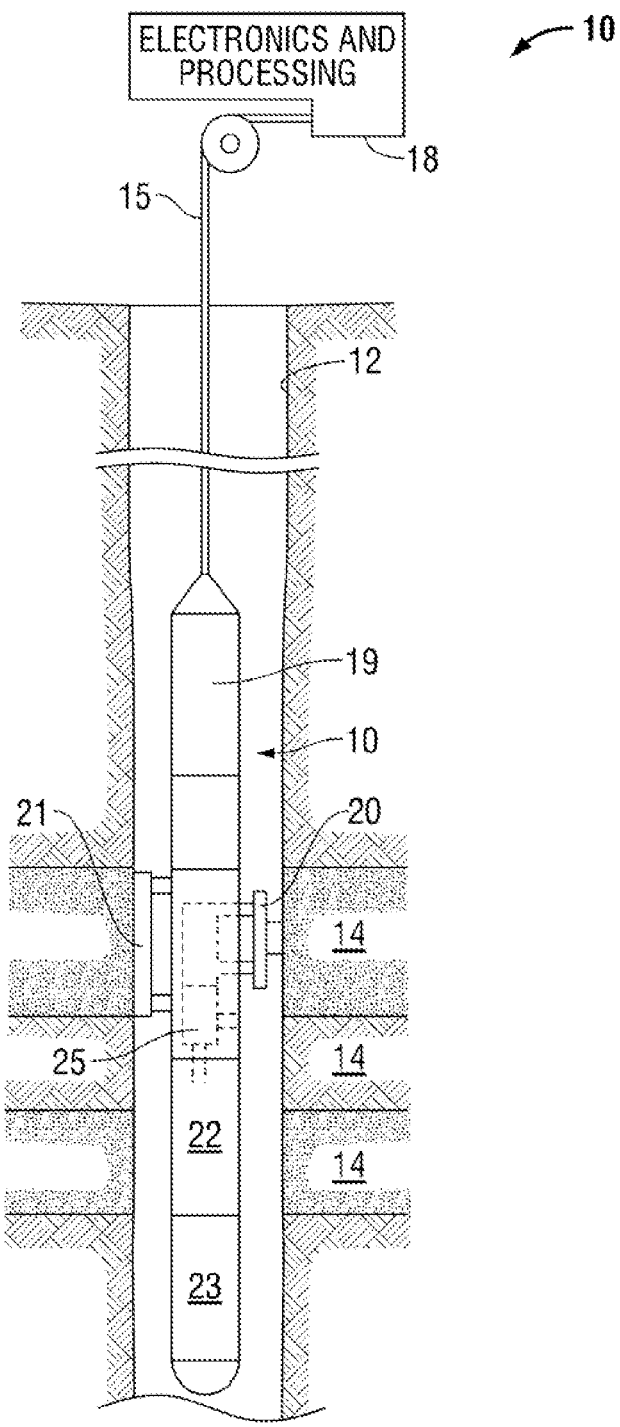
FIG. 1A is a schematic diagram of an exemplary petroleum reservoir fluid analysis tool that can be used as part of the methodology of the present invention.

FIG. 1A illustrates an exemplary tool 10 for petroleum reservoir downhole fluid analysis that can be used as part of a workflow for reservoir analysis in accordance with the present invention. The tool 10 is suspended in the borehole 12 from the lower end of a typical multiconductor cable 15 that is spooled in a usual fashion on a suitable winch on the earth's surface. The cable 15 is electrically coupled to an electrical control system 18 on the earth's surface. The tool 10 includes an elongated body 19 which carries a selectively extendable fluid admitting assembly 20 and a selectively extendable tool anchoring member 21 which are respectively arranged on opposite sides of the tool body 19. The fluid admitting assembly 20 is equipped for selectively sealing off or isolating selected portions of the wall of the borehole 12 such that fluid communication with the adjacent earth formation 14 is established. The fluid admitting assembly 20 and tool 10 include a flowline leading to a fluid analysis module 25. The formation fluid obtained by the fluid admitting assembly 20 flows through the flowline and through the fluid analysis module 25. The fluid may thereafter be expelled through a port or it may be sent to one or more fluid collecting chambers 22 and 23 which may receive and retain the fluids obtained from the formation. With the fluid admitting assembly 20 sealingly engaging the formation 14, a short rapid pressure drop can be used to break the mudcake seal. Normally, the first fluid drawn into the tool 10 will be highly contaminated with mud filtrate. As the tool 10 continues to draw fluid from the formation 14, the area near the fluid admitting assembly 20 cleans up and reservoir fluid becomes the dominant constituent. The time required for cleanup depends upon many parameters, including formation permeability, fluid viscosity, the pressure differences between the borehole and the formation, and overbalanced pressure difference and its duration during drilling. Increasing the pump rate can shorten the cleanup time, but the rate must be controlled carefully to preserve formation pressure conditions.

The fluid analysis module 25 includes means for measuring the temperature and pressure of the fluid in the flowline. The fluid analysis module 25 derives properties that characterize the formation fluid sample at the flowline pressure and temperature. In the preferred embodiment, the fluid analysis module 25 measures absorption spectra and translates such measurements into concentrations of several alkane components and groups (or lumps) in the fluid sample. In an illustrative embodiment, the fluid analysis module 25 provides measurements of the concentrations (e.g., weight percentages) of carbon dioxide ($CO_2$), methane ($CH_4$), ethane ($C_2H_6$), the C3-C5 alkane group, the lump of hexane and heavier alkane components (C6+), and asphaltene content. The C3-C5 alkane group includes propane, butane, and pentane. The C6+ alkane group includes hexane ($C_6H_{14}$), heptane ($C_7H_{16}$), octane ($C_8H_{18}$), nonane ($C_9H_{20}$), decane ($C_{10}H_{22}$), hendecane ($C_{11}H_{24}$)—also referred to as endecane or undecane, dodecane ($C_{12}H_{26}$), tridecane ($C_{13}H_{28}$), tetradecane ($C_{14}H_{30}$), pentadecane ($C_{15}H_{32}$), hexadecane ($C_{16}H_{34}$), etc. The fluid analysis module 25 also provides a means that measures live fluid density ($\rho$) at the flowline temperature and pressure, live fluid viscosity ($\mu$) at flowline temperature and pressure (in cp), formation pressure, and formation temperature.

Control system 18 maintains control of the fluid admitting assembly 20 and fluid analysis module 25 and the flow path to the fluid collecting chambers 22, 23. As will be appreciated by those skilled in the art, the fluid analysis module 25 and the surface-located electrical control system 18 include data processing functionality (e.g., one or more microprocessors, associated memory, and other hardware and/or software) to implement the invention as described herein. The electrical control system 18 can also be realized by a distributed data processing system wherein data measured by the tool 10 is communicated (preferably in real time) over a communication link (typically a satellite link) to a remote location for data analysis as described herein. The data analysis can be carried out on a workstation or other suitable data processing system (such as a computer cluster or computing grid).

Formation fluids sampled by the tool 10 may be contaminated with mud filtrate. That is, the formation fluids may be contaminated with the filtrate of a drilling fluid that seeps into the formation 14 during the drilling process. Thus, when fluids are withdrawn from the formation 14 by the fluid admitting assembly 20, they may include mud filtrate. In some examples, formation fluids are withdrawn from the formation 14 and pumped into the borehole or into a large waste chamber in the tool 10 until the fluid being withdrawn becomes sufficiently clean. A clean sample is one where the concentration of mud filtrate in the sample fluid is acceptably low so that the fluid substantially represents native (i.e., naturally occurring) formation fluids. In the illustrated example, the tool 10 is provided with fluid collecting chambers 22 and 23 to store collected fluid samples.

The tool 10 of FIG. 1A is adapted to make in situ determinations regarding hydrocarbon-bearing geological formations by downhole sampling of reservoir fluid at one or more measurement stations within the borehole 12, and by conducting downhole fluid analysis of one or more reservoir fluid samples for each measurement station (including compositional analysis such as estimating concentrations of a plurality of compositional components of a given sample and other fluid properties).

Figure 1B:
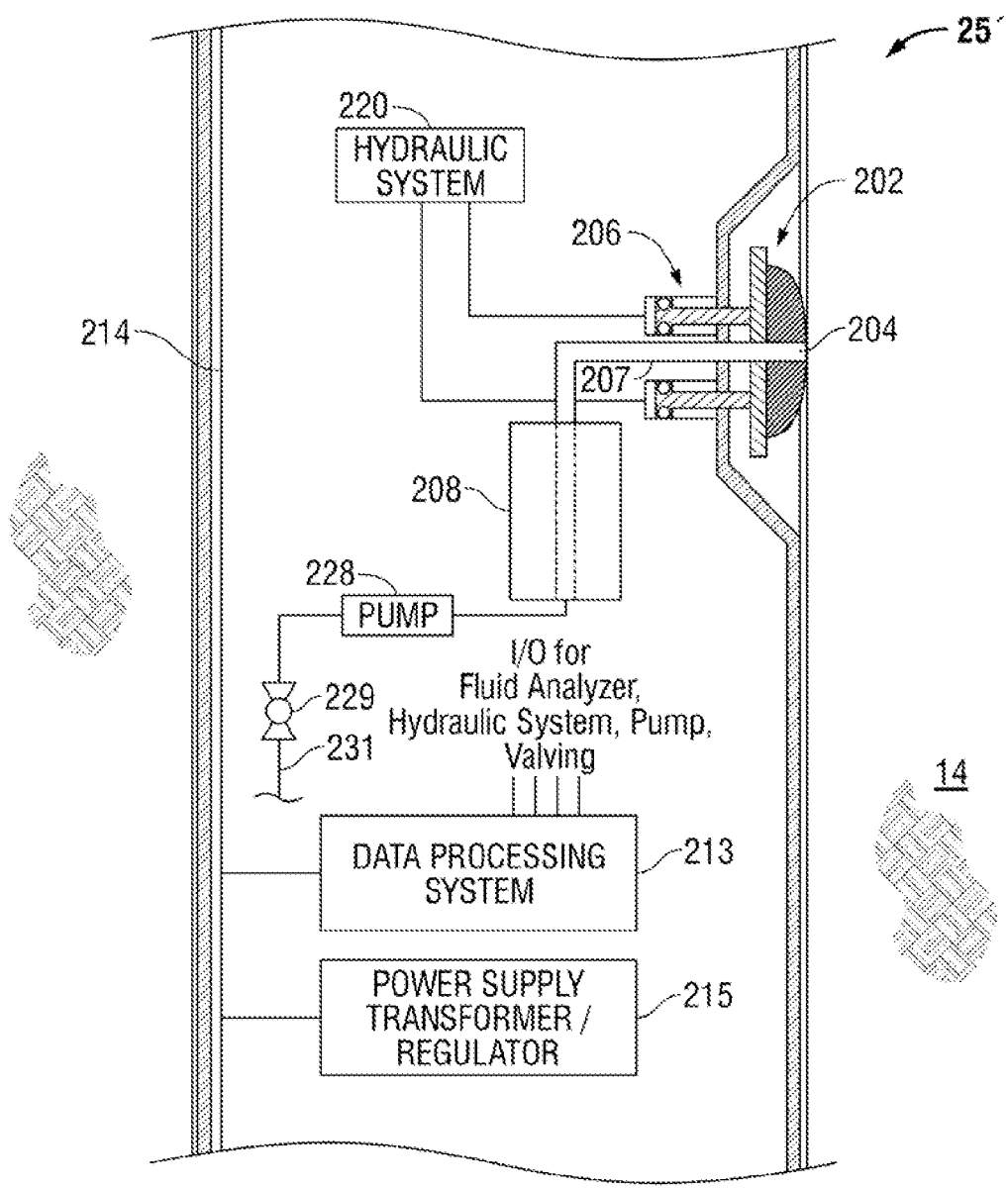
FIG. 1B is a schematic diagram of an exemplary fluid analysis module suitable for use in the tool of FIG. 1A.

FIG. 1B illustrates an exemplary embodiment of the fluid analysis module 25 of FIG. 1A (labeled 25'), including a probe 202 having a port 204 to admit formation fluid therein. A hydraulic extending mechanism 206 may be driven by a hydraulic system 220 to extend the probe 202 to sealingly engage the formation 14. In alternative implementations, more than one probe can be used, or inflatable packers can replace the probe(s) and function to establish fluid connections with the formation and sample fluid samples.

The probe 202 can be realized by the Quicksilver Probe available from Schlumberger Technology Corporation of Sugar Land, Texas, USA. The Quicksilver Probe divides the fluid flow from the reservoir into two concentric zones, a central zone isolated from a guard zone about the perimeter of the central zone. The two zones are connected to separate flowlines with independent pumps. The pumps can be run at different rates to exploit filtrate/fluid viscosity contrast and permeability anistrotropy of the reservoir. Higher intake velocity in the guard zone directs contaminated fluid into the guard zone flowline, while clean fluid is drawn into the central zone. Fluid analyzers analyze the fluid in each flowline to determine the composition of the fluid in the respective flowlines. The pump rates can be adjusted based on such compositional analysis to achieve and maintain desired fluid contamination levels. The operation of the Quicksilver Probe efficiently separates contaminated fluid from cleaner fluid early in the fluid extraction process, which results in obtaining clean fluid in much less time compared to traditional formation testing tools.

The fluid analysis module 25' includes a flowline 207 that carries formation fluid from the port 204 through a fluid analyzer 208. The fluid analyzer 208 includes a light source that directs light to a sapphire prism disposed adjacent the flowline fluid flow. The reflection of such light is analyzed by a gas refractometer and dual fluoroscene detectors. The gas refractometer qualitatively identifies the fluid phase in the flowline. At the selected angle of incidence of the light emitted from the diode, the reflection coefficient is much larger when gas is in contact with the window than when oil or water is in contact with the window. The dual fluoroscene detectors detect free gas bubbles and retrograde liquid dropout to accurately detect single phase fluid flow in the flowline 207. Fluid type is also identified. The resulting phase information can be used to define the difference between retrograde condensates and volatile oils, which can have similar gas-oil ratios (GORs) and live oil densities. It can also be used to monitor phase separation in real time and ensure single phase sampling. The fluid analyzer 208 also includes dual spectrometers—a filter array spectrometer and a grating-type spectrometer.

The filter array spectrometer of the analyzer 208 includes a broadband light source providing broadband light that passes along optical guides and through an optical chamber in the flowline 207 to an array of optical density detectors that are designed to detect narrow frequency bands (commonly referred to as channels) in the visible and near-infrared spectra as described in U.S. Pat. No. 4,994,671, incorporated herein by reference in its entirety. Preferably, these channels include a subset of channels that detect water absorption peaks (which are used to characterize water content in the fluid) and a dedicated channel corresponding to the absorption peak of $CO_2$ with dual channels above and below this dedicated channel that subtract out the overlapping spectrum of hydrocarbon and small amounts of water (which are used to characterize $CO_2$ content in the fluid). The filter array spectrometer also employs optical filters that provide for identification of the color (also referred to as "optical density" or "OD") of the fluid in the flowline. Such color measurements support fluid identification, determination of asphaltene content and pH measurement. Mud filtrates or other solid materials generate noise in the channels of the filter array spectrometer. Scattering caused by these particles is independent of wavelength. In the preferred embodiment, the effect of such scattering can be removed by subtracting a nearby channel.

The grating-type spectrometer of the fluid analyzer 208 is designed to detect channels in the near-infrared spectra (preferably between 1600 and 1800 nm) where reservoir fluid has absorption characteristics that reflect molecular structure.

The fluid analyzer 208 also includes a pressure sensor for measuring pressure of the formation fluid in the flowline 207, a temperature sensor for measuring temperature of the formation fluid in the flowline 207, and a density sensor for measuring live fluid density of the fluid in the flowline 207. In the preferred embodiment, the density sensor is realized by a vibrating sensor that oscillates in two perpendicular modes within the fluid. Simple physical models describe the resonance frequency and quality factor of the sensor in relation to live fluid density. Dual mode oscillation is advantageous over other resonant techniques because it minimizes the effects of pressure and temperature on the sensor through common mode rejection. In addition to density, the density sensor can also provide a measurement of live fluid viscosity from the quality factor of oscillation frequency. Note that live fluid viscosity can also be measured by placing a vibrating object in the fluid flow and measuring the increase in line width of any fundamental resonance. This increase in line width is related closely to the viscosity of the fluid. The change in frequency of the vibrating object is closely associated with the mass density of the object. If density is measured independently, then the determination of viscosity is more accurate because the effects of a density change on the mechanical resonances are determined. Generally, the response of the vibrating object is calibrated against known standards. The fluid analyzer 208 can also measure resistivity and pH of fluid in the flowline 207. In the preferred embodiment, the fluid analyzer 208 is realized by the InSitu Fluid Analyzer available from Schlumberger Technology Corporation. In other exemplary implementations, the flowline sensors of the fluid analyzer 208 may be replaced or supplemented with other types of suitable measurement sensors (e.g., NMR sensors and capacitance sensors). Pressure sensor(s) and/or temperature sensor(s) for measuring pressure and temperature of fluid drawn into the flowline 207 can also be part of the probe 202.

A pump 228 is fluidly coupled to the flowline 207 and is controlled to draw formation fluid into the flowline 207 and to supply formation fluid to the fluid collecting chambers 22 and 23 (FIG. 1A) via valve 229 and flowpath 231 (FIG. 1B).

The fluid analysis module 25' includes a data processing system 213 that receives and transmits control and data signals to the other components of the module 25' for controlling operations of the module 25'. The data processing system 213 also interfaces to the fluid analyzer 208 for receiving, storing, and processing the measurement data generated therein. In the preferred embodiment, the data processing system 213 processes the measurement data output by the fluid analyzer 208 to derive and store measurements of the hydrocarbon composition of fluid samples analyzed in situ by the fluid analyzer 208, including flowline temperature;

flowline pressure;

live fluid density ($\rho$) at the flowline temperature and pressure;

live fluid viscosity ($\mu$) at flowline temperature and pressure;

concentrations (e.g., weight percentages) of carbon dioxide ($CO_2$), methane ($CH_4$), ethane ($C_2H_6$), the C3-C5 alkane group, the lump of hexane and heavier alkane components (C6+), and asphaltene content;

GOR; and possibly other parameters (such as API gravity and oil formation volume factor (Bo)).

Flowline temperature and pressure are measured by the temperature sensor and pressure sensor, respectively, of the fluid analyzer 208 (and/or probe 202). In the preferred embodiment, the output of the temperature sensor(s) and pressure sensor(s) are monitored continuously before, during, and after sample acquisition to derive the temperature and pressure of the fluid in the flowline 207. The formation temperature is not likely to deviate substantially from the flowline temperature at a given measurement station and thus can be estimated as the flowline temperature at the given measurement station in many applications. Formation pressure can be measured by the pressure sensor of the fluid analyzer 208 in conjunction with the downhole fluid sampling and analysis at a particular measurement station after buildup of the flowline to formation pressure.

Live fluid density ($\rho$) at the flowline temperature and pressure is determined by the output of the density sensor of the fluid analyzer 208 at the time the flowline temperature and pressure are measured.

Live fluid viscosity ($\mu$) at flowline temperature and pressure is derived from the quality factor of the density sensor measurements at the time the flowline temperature and pressure are measured.

The measurements of the hydrocarbon composition of fluid samples are derived by translation of the data output by spectrometers of the fluid analyzer 208.

The GOR is determined by measuring the quantity of methane and liquid components of crude oil using near-infrared absorption peaks. The ratio of the methane peak to the oil peak on a single phase live crude oil is directly related to GOR.

The fluid analysis module 25' can also detect and/or measure other fluid properties of a live oil sample, including retrograde dew formation, asphaltene precipitation, and/or gas evolution.

The fluid analysis module 25' also includes a tool bus 214 that communicates data signals and control signals between the data processing system 213 and the surface-located control system 18 of FIG. 1A. The tool bus 214 can also carry electrical power supply signals generated by a surface-located power source for supply to the fluid analysis module 25', and the module 25' can include a power supply transformer/regulator 215 for transforming the electric power supply signals supplied via the tool bus 214 to appropriate levels suitable for use by the electrical components of the module 25'.

Although the data processing components of FIG. 1B are shown and described above as being communicatively coupled and arranged in a particular configuration, persons of ordinary skill in the art will appreciate that the components of the fluid analysis module 25' can be communicatively coupled and/or arranged differently than depicted in FIG. 1B without departing from the scope of the present disclosure. In addition, the example methods, apparatus, and systems described herein are not limited to a particular conveyance type but, instead, may be implemented in connection with different conveyance types including, for example, coiled tubing, wireline, wired drill pipe, and/or other conveyance means known in the industry.

Figure 2A:
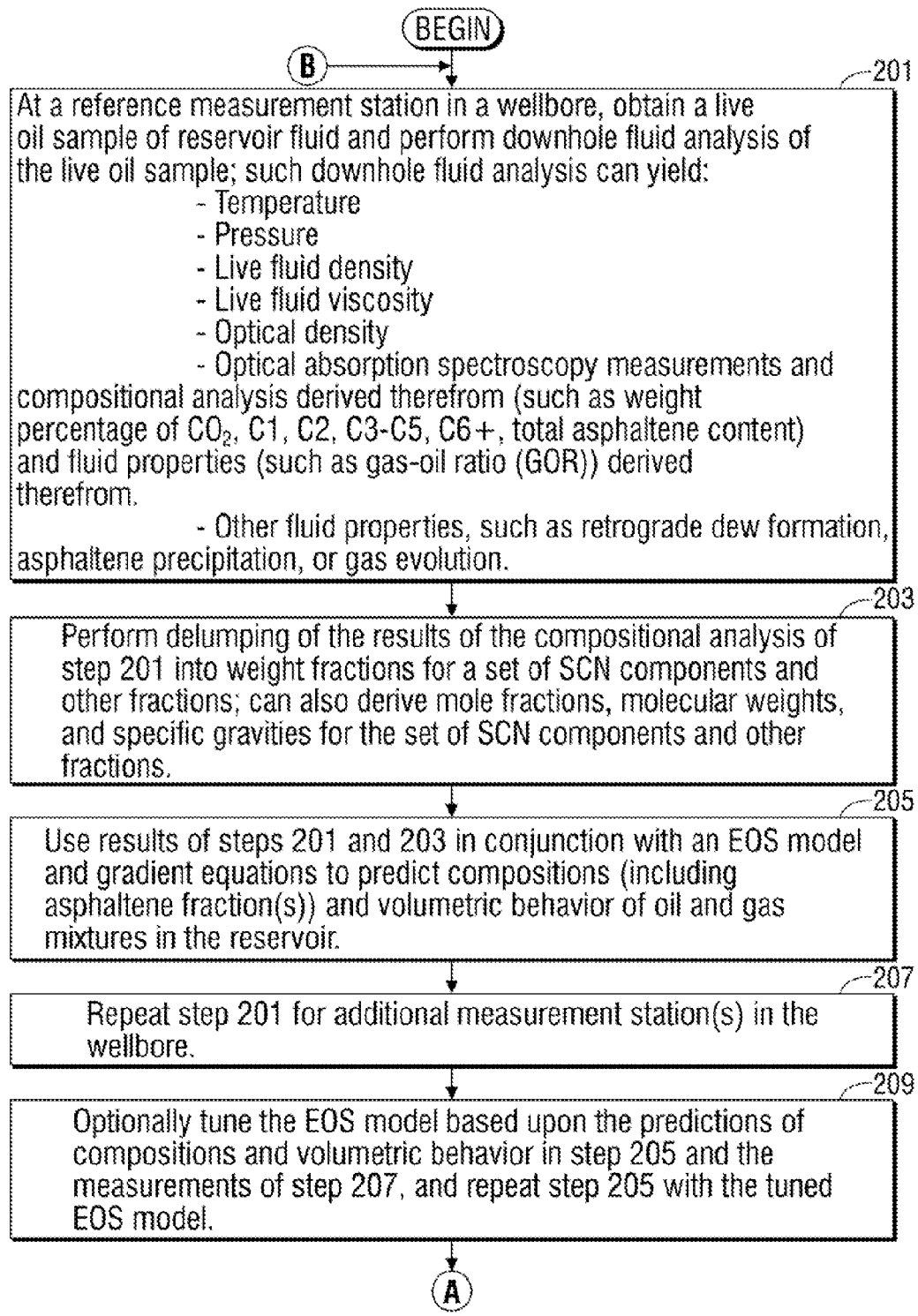
FIGS. 2A-2C, collectively, are a flow chart of exemplary data analysis operations that are part of the workflow for reservoir analysis in accordance with the present invention.
Figure 2B:
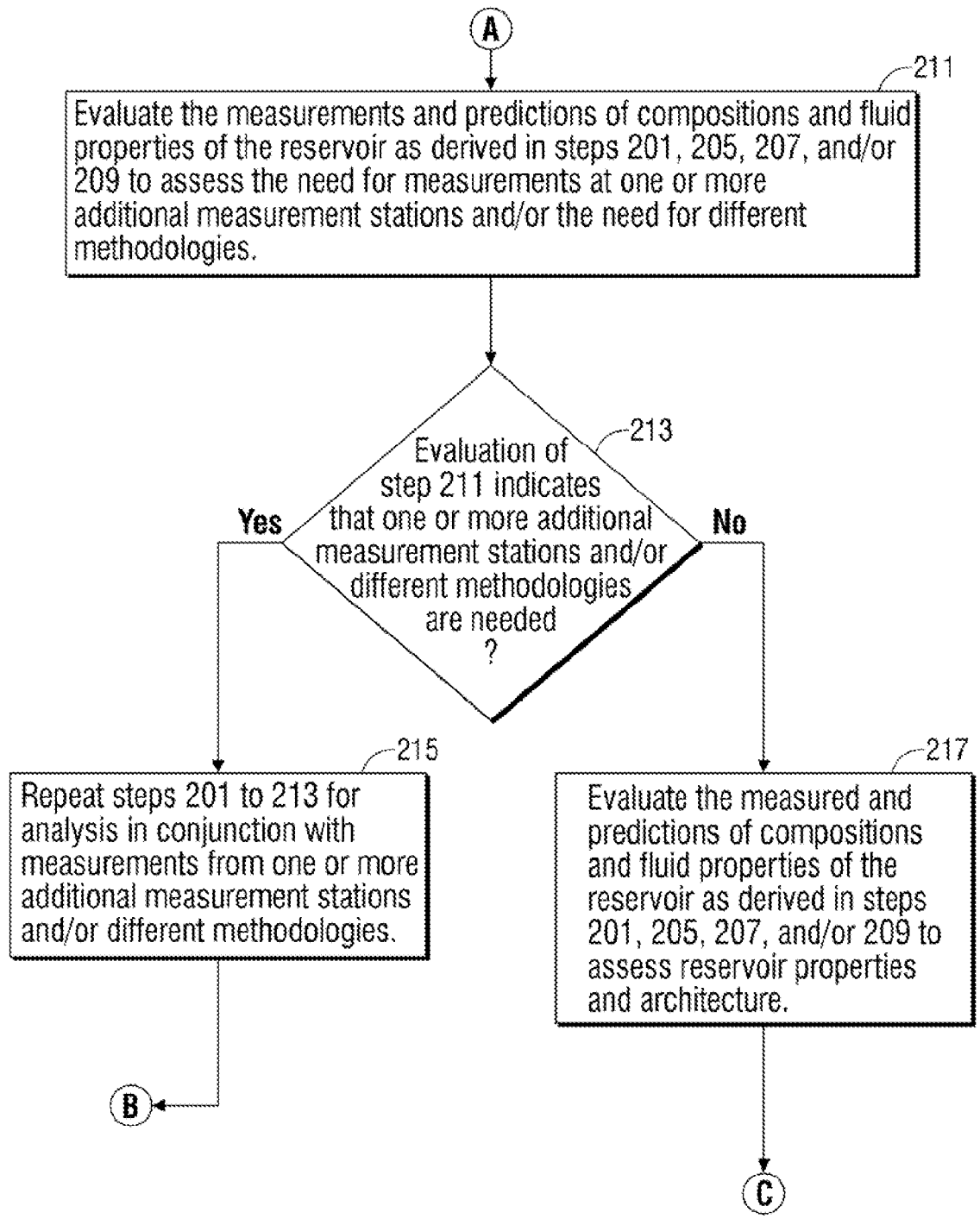
Figure 2C:
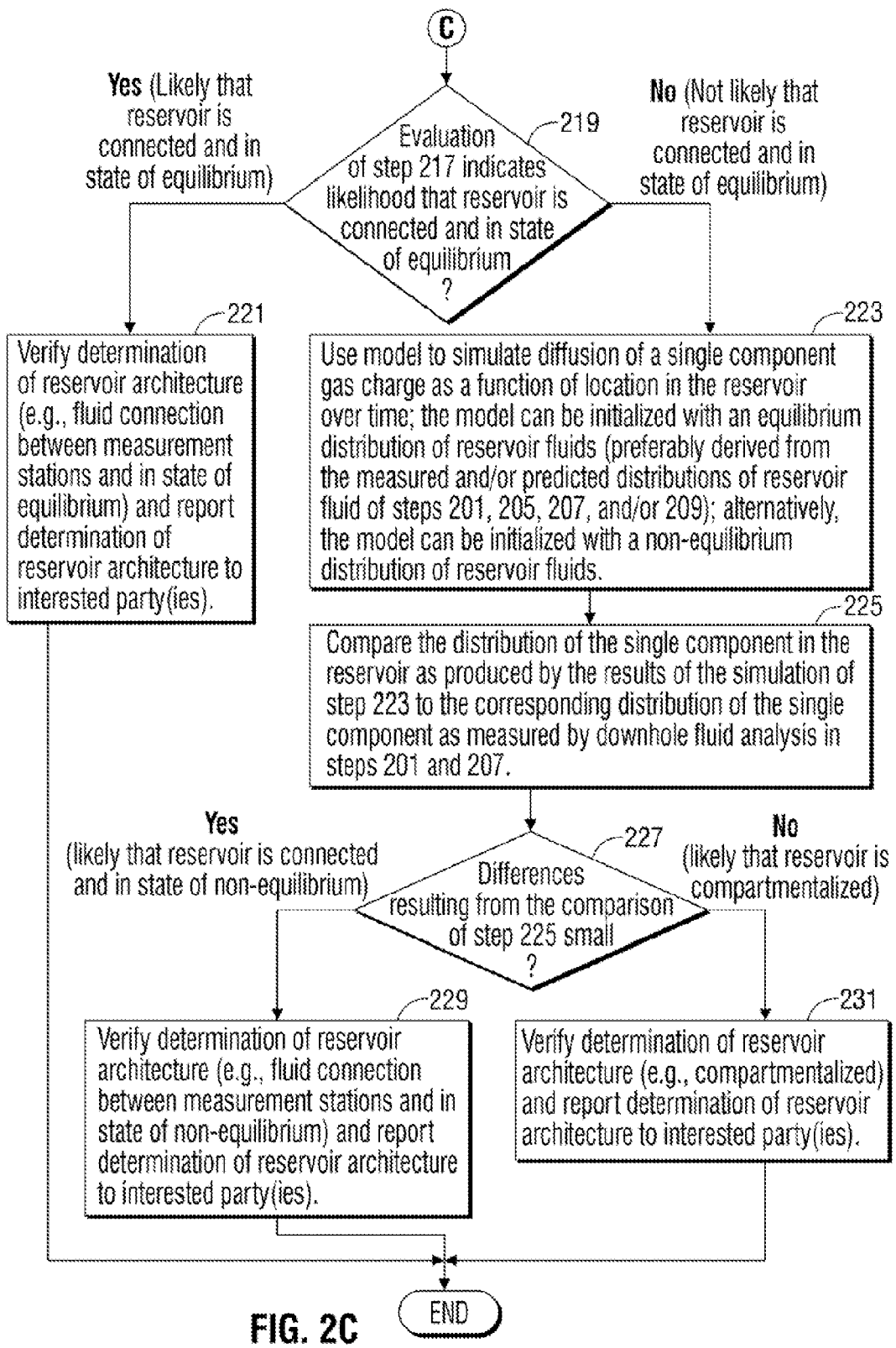

In accordance with the present invention, the tool 10 of FIGS. 1A and 1B can be employed as part of the methodology of FIGS. 2A-2C to evaluate a petroleum reservoir of interest. As will be appreciated by those skilled in the art, the surface-located electrical control system 18 and the fluid analysis module 25 of the tool 10 each include data processing functionality (e.g., one or more microprocessors, associated memory, and other hardware and/or software) that cooperate to implement the invention as described herein. The electrical control system 18 can also be realized by a distributed data processing system wherein data measured by the tool 10 is communicated in real time over a communication link (typically a satellite link) to a remote location for data analysis as described herein. The data analysis can be carried out on a workstation or other suitable data processing system (such as a computer cluster or computing grid).

The operations of FIGS. 2A-2C begin in step 201 by employing the tool 10 of FIGS. 1A and 1B to obtain a sample of the formation fluid at the reservoir pressure and temperature (a live oil sample) at a measurement station in the wellbore (for example, a reference station), and the sample is processed in the downhole environment by the fluid analysis module 25. In the preferred embodiment, the fluid analysis module 25 performs spectrophotometry measurements that measure absorption spectra of the live oil sample and translates such spectrophotometry measurements into concentrations of several alkane components and groups (or lumps) in the fluids of interest. In an illustrative embodiment, the fluid analysis module 25 provides measurements of the concentrations (e.g., weight percentages) of carbon dioxide ($CO_2$), methane ($CH_4$), ethane ($C_2H_6$), the C3-C5 alkane group including propane, butane, pentane, the lump of hexane and heavier alkane components (C6+), and asphaltene content. The tool 10 also preferably provides a means to measure temperature of the fluid sample (and thus reservoir temperature at the station), pressure of the fluid sample (and thus reservoir pressure at the station), live fluid density of the fluid sample, live fluid viscosity of the fluid sample, gas-oil ratio (GOR) of the fluid sample, optical density, and possibly other fluid properties (such as API gravity, formation volume fraction ($B_O$), retrograde dew formation, asphaltene precipitation, and gas evolution) of the fluid sample.

As part of step 201, the tool 10 can also be controlled to collect and store one or more isolated live oil samples in fluid collecting chambers 22, 23 (FIG. 1A) of the tool 10. The respective live oil sample is collected at reservoir conditions (at the formation temperature and pressure) for the measurement station and stored within a sealed sample container at these conditions for transport uphole to the wellsite when the tool is withdrawn from the wellbore.

As part of step 201, isolated core samples can also be acquired by the tool 10 and stored within the tool 10 for transport uphole to the wellsite when the tool is withdrawn from the wellbore. Alternatively, a separate coring tool can be used to acquire isolated core sample from the wellbore. There are several types of core samples that can be recovered from the wellbore, including full diameter cores, oriented cores, native state cores, and sidewall cores. Coring operations can be run in combination with other suitable logging operations (such as gamma ray logging) to correlate with openhole logs for accurate, real time depth control of the coring points.

In step 203, a delumping process is performed that characterizes the compositional components of the live oil sample analyzed by the downhole fluid analysis of step 201. The delumping process splits the concentration (e.g., mass fraction, which is sometimes referred to as weight fraction) of given compositional lumps (C3-C5, C6+) into concentrations (e.g., mass fractions) for single carbon number (SCN) components of the given compositional lump (e.g., split C3-C5 lump into C3, C4, C5, and split C6+ lump into C6, C7, C8 . . . ). Details of the exemplary delumping operations carried out as part of step 203 are described in detail in U.S. Pat. No. 7,920,970, incorporated herein by reference in its entirety.

In step 205, the results of the delumping process of step 203 are used in conjunction with an equation of state (EOS) model (and possibly other predictive models) to predict compositional gradients and other property gradients (such as volumetric behavior of oil and gas mixtures) as a function of depth within the wellbore. In the preferred embodiment, the analyses of steps 203 and 205 are performed in real time in conjunction with the downhole fluid analysis of step 201 in order to provide guidance as to the accuracy and effectiveness of the downhole fluid analysis and make a decision as to whether additional downhole fluid analysis is necessary. Other suitable reservoir property modeling schemes can be used.

The equation of state (EOS) model describes the thermodynamic behavior of the fluid and provides for characterization of the reservoir fluid at different locations within the reservoir. With the reservoir fluid characterized with respect to its thermodynamic behavior, fluid production parameters, transport properties, and other commercially useful indicators of the reservoir can be computed.

For example, the EOS model can provide the phase envelope that can be used to interactively vary the rate at which samples are collected in order to avoid entering the two phase region. In another example, the EOS can provide useful properties in assessing production methodologies for the reservoir. Such properties can include density, viscosity, and volume of gas formed from a liquid after expansion to a specified temperature and pressure. The characterization of the fluid sample with respect to its thermodynamic model can also be used as a benchmark to determine the validity of the obtained sample, whether to retain the sample, and/or whether to obtain another sample at the location of interest. More particularly, based on the thermodynamic model and information regarding formation pressures, sampling pressures, and formation temperatures, if it is determined that the fluid sample was obtained near or below the bubble line of the sample, a decision may be made to jettison the sample and/or to obtain another sample at a slower rate (i.e., a smaller pressure drop) so that gas will not evolve out of the sample. Alternatively, because knowledge of the exact dew point of a retrograde gas condensate in a formation is desirable, a decision may be made (when conditions allow) to vary the pressure drawdown in an attempt to observe the liquid condensation and thus establish the actual saturation pressure.

In the preferred embodiment, the modeling operations of step 205 employ a particular equation of state model, referred to herein as the Flory-Huggins-Zuo (FHZ) EOS model, that derives compositional gradients and other property gradients (e.g., pressure and temperature gradients) that describe the volumetric behavior of the oil and gas (and possibly water) mixture in reservoir fluids as a function of depth in the reservoir of interest. The compositional gradients derived from the FHZ EOS model preferably include mass fractions, mole fractions, molecular weights, and specific gravities for a set of psuedocomponents of the formation fluid. Preferably, such psuedocomponents include a heavy psuedocomponent representing asphaltenes in the formation fluid, a second distallate psuedocomponent that represents the non-asphaltene liquid fraction of the formation fluid, and a third light psuedocomponent that presents gases in the formation fluid. The psuedocomponents derived from the FHZ EOS model can also represent single carbon number (SCN) components as well as other fractions or lumps of the formation fluid (such as a water fraction) as desired. The FHZ EOS model can predict composition gradients with depth that take into account the impacts of gravitational forces, chemical forces, thermal diffusion, etc. as taught in International Patent Application Publication WO 2011/007268, incorporated herein by reference in its entirety. Other applications of the FHZ EOS have been described in U.S. Pat. Nos. 7,822,554 and 7,920,970, US Patent Application Publications 2009/0248310 and 2009/0312997, International Patent Application Publications WO 2009/138911 and WO 2011/030243, U.S. patent application Ser. No. 12/752,967, and International Patent Application PCT/IB2011/051740, incorporated herein by reference in their entireties. For some cases, one or more terms of the FHZ EOS model dominate and the other terms can be ignored. For example, in low GOR black oils, the gravity term of the FHZ EOS model dominates and the term related to chemical forces (solubility) and thermal diffusion (entropy) can be ignored.

The FHZ EOS model employs an equation of state together with flash calculations to predict compositions (including asphaltene) as a function of depth in the reservoir. The equation of state represents the phase behavior of the compositional components of the reservoir fluid. Such equation of state can take many forms. For example, it can be any one of many cubic EOS as is well known. Such cubic EOS include van der Waals EOS (1873), Redlich-Kwong EOS (1949), Soave-Redlich-Kwong EOS (1972), Peng-Robinson EOS (1976), Stryjek-Vera-Peng-Robinson EOS (1986), and Patel-Teja EOS (1982). Volume shift parameters can be employed as part of the cubic EOS in order to improve liquid density predictions as is well known. Mixing rules (such as van der Waals mixing rule) can also be employed as part of the cubic EOS. A SAFT-type EOS can also be used as is well known in the art. The equation of state is extended to predict compositional gradients (including an asphaltene compositional gradient) with depth that take into account the impacts of gravitational forces, chemical forces, and thermal diffusion. The flash calculations solve for fugacities of components that form at equilibrium.

As part of step 205, the asphaltene compositional gradient produced by the FHZ EOS model can be used to derive a profile of asphaltene pseudocomponents (e.g., asphaltene nanoaggregates and larger asphaltene clusters) and corresponding aggregate size of asphaltenes as a function of depth in the reservoir of interest as taught in International Patent Application Publication WO 2011/007268.

As part of step 205, the asphaltene property gradient produced by the FHZ EOS model can also be used to predict gradients for fluid properties (such as fluid density and fluid viscosity) that relate to asphaltene content. For predicting viscosity, the predictions can be based on the empirical correlation of the form proposed by Lohrenz, Bray and Clark in "Calculating Viscosity of Reservoir Fluids from their Composition," *Journal of Petroleum Technology*, October 1964, pp. 1171-1176, or the empirical correlation of the form proposed by Pedersen et al. in "Viscosity of Crude Oils," *Chemical Engineering Science*, Vol. 39, No. 6, pp. 1011-1016, 1984.

An illustrative example of an FHZ EOS model assumes that there are reservoir fluids with a number of compositional components and that the reservoir fluids are connected (i.e., there is a lack of compartmentalization) and in a state of thermodynamic equilibrium. Moreover, it is assumed that there are no adsorption phenomena or any kind of chemical reactions in the reservoir. The mass flux (J) of compositional component i that crosses the boundary of an elementary volume of the porous media is expressed as:

$$J_i = \rho_i \left( \sum_{j=1}^{n} (L_{ij} \nabla_T g_j^t) + L_{ip}(\rho g - \nabla P) + L_{iq} \nabla T \right) \quad (1)$$

where $L_{ij}$, $L_{ip}$, and $L_{iq}$ are the phenomenological coefficients, $\rho_i$ denotes the partial density of component i, $\rho$, g, P, T are the density, the gravitational acceleration, pressure, and temperature, respectively, and $g_j^t$ is the contribution of component j to mass free energy of the fluid in a porous media, which can be divided into a chemical potential part $\mu_j$ and a gravitational part gz (where z is the vertical depth).

The average fluid velocity (u) is estimated by:

$$u = \frac{\sum_{j=1}^{n} J_j}{\rho}. \quad (2)$$

According to Darcy's law, the phenomenological baro-diffusion coefficients must meet the following constraint:

$$\frac{k}{\eta} = \frac{\sum_{j=1}^{n} \rho_j L_{jp}}{\rho} \quad (3)$$

where k and $\eta$ are the permeability and the viscosity, respectively.

If the pore size is far above the mean free path of molecules, the mobility of the components, due to an external pressure field, is very close to the overall mobility. The mass chemical potential is a function of mole fraction (x), pressure, and temperature.

At constant temperature, the derivative of the mass chemical potential ($\mu_j$) has two contributions:

$$\nabla_T \mu_j = \sum_{k=1}^{n} \left(\frac{\partial \mu_j}{\partial x_k}\right)_{T,P,x_{j \neq k}} \nabla x_k + \left(\frac{\partial \mu_j}{\partial P}\right)_{T,x} \nabla P \quad (4)$$

where the partial derivatives can be expressed in terms of EOS (fugacity coefficients):

$$\left(\frac{\partial \mu_j}{\partial x_k}\right)_{T,P,x_{j \neq k}} = \frac{RT}{M_j}\left(\frac{\partial \ln f_j}{\partial x_k}\right)_{T,P,x_{j \neq k}} \quad (5)$$
$$= \frac{RT}{M_j}\left(\frac{\delta_{jk}}{x_k} + \frac{1}{\varphi_j}\left(\frac{\partial \varphi_j}{\partial x_k}\right)_{T,P,x_{j \neq k}}\right)$$

$$\left(\frac{\partial \mu_j}{\partial P}\right)_{T,x} = \frac{\bar{v}_j}{M_j} \quad (6)$$
$$= \frac{RT}{M_j}\left(\frac{1}{P} + \left(\frac{\partial \varphi_j}{\partial P}\right)_{T,x}\right)$$

where $M_j$, $f_j$, $\varphi_j$, and $v_j$ are the molecular weight, fugacity, fugacity coefficient, and partial molar volume of component j, respectively;

$x_k$ is the mole fraction of component k;

R denotes the universal gas constant; and $\delta$ is the Kronecker delta function.

In the ideal case, the phenomenological coefficients (L) can be related to effective practical diffusion coefficients ($D_i^{eff}$):

$$L_{ii} = -\frac{M_i}{RT} D_i^{eff}. \quad (7)$$

The mass conservation for component i in the reservoir fluid, which governs the distribution of the components in the porous media, is expressed as:

$$\frac{\partial \rho_i}{\partial t} + \nabla J_i = 0, \quad (8)$$
$$i = 1, 2, \ldots, n.$$

Eq. (8) can be used to solve a wide range of problems. This is a dynamic model which is changing with time t.

Consider that the mechanical equilibrium of the fluid column has been achieved:

$$\nabla_z P = \rho g. \quad (9)$$

The vertical distribution of the components can be calculated by solving the following set of equations:

$$\frac{\partial \ln f_i}{\partial z} - \frac{M_i g}{RT} + \frac{J_{i,z}}{x_i D_i^{eff}}\frac{M}{\rho M_i} - \frac{L_{iq}}{D_i^{eff}}\frac{\partial T}{\partial z} = 0, \quad (10)$$
$$i = 1, 2, \ldots, n$$
and $$\sum_{k=1}^{n}\left(\frac{\delta_{ik}}{x_k} + \frac{1}{\varphi_i}\frac{\partial \varphi_i}{\partial x_k}\right)\nabla_z x_k + \frac{(v_i \rho - M_i)g}{RT} + \frac{J_{i,z}}{x_i D_i^{eff}}\frac{M}{\rho M_i} - \frac{L_{iq}}{D_i^{eff}}\frac{\partial T}{\partial z} = 0 \quad (11)$$

where $J_{i,z}$ is the vertical component of the external mass flux. This formulation allows computation of the stationary state of the fluid column and it does not require modeling of the dynamic process leading to the observed compositional distribution.

If the horizontal components of external fluxes are significant, the equations along the other axis have to be solved as well. Along a horizontal "x" axis the equations become:

$$\frac{\partial \ln f_i}{\partial x} + \frac{J_{i,x}}{x_i D_i^{eff}}\frac{M}{\rho M_i} - \frac{L_{iq}}{D_i^{eff}}\frac{\partial T}{\partial x} = 0. \quad (12)$$

The mechanical equilibrium of the fluid column $\nabla_z P = \rho g$, is a particular situation which will occur only in highly permeable reservoirs. In the general case, the vertical pressure gradient is calculated by:

$$\nabla_z P = \rho g - \frac{\nabla_z P_{Fluxes} + \nabla_z P_{Soret}}{1 + R_p} \quad (13)$$

where $R_p$ is calculated by $$R_p = RT\frac{k}{\eta}\frac{\rho}{M}\sum_{i=1}^{n}\frac{x_i}{D_i^{eff}}. \quad (14)$$

The pressure gradient contribution from thermal diffusion (so-called Soret contribution) is given by:

$$\nabla_z P_{Soret} = RT\frac{\rho}{M}\sum_{i=1}^{n} x_i \frac{L_{iq}}{D_i^{eff}} \nabla_z T. \quad (15)$$

And the pressure gradient contribution from external fluxes is expressed as $$\nabla_z P_{Fluxes} = RT\sum_{i=1}^{n}\frac{J_{i,z}}{M_i D_i^{eff}}. \quad (16)$$

Assuming an isothermal reservoir and ignoring the external flux, results in the following equation:

$$\frac{\partial \ln f_i}{\partial z} - \frac{M_i g}{RT} = 0, \quad (17)$$
$$i = 1, 2, \ldots, n.$$

Eq. (17) can be rewritten as $$\frac{\partial \ln f_i}{\partial z} - \frac{M_i g}{RT} + a_i = 0, \quad (18)$$
$$i = 1, 2, \ldots, n$$

where $a_i$ is computed by:

$$a_i = \frac{J_{i,z}}{x_i D_i^{eff}} \frac{M}{\rho M_i} - \frac{L_{iq}}{D_i^{eff}} \frac{\partial T}{\partial z}, \quad (19)$$

$$i = 1, 2, \ldots, n.$$

Eq. (18) and (19) can be solved to predict compositions and volumetric behavior of oil and gas mixtures in the reservoir. Flash calculations are used to solve for the fugacities (f) of the components of the oil and gas mixtures in equilibrium.

In step 207, the downhole sampling and analysis operations of step 201 can be repeated for additional measurement stations within the wellbore as desired.

In step 209, the EOS model utilized in step 205 can be tuned in accordance with downhole fluid analysis measurements acquired in step 207 and/or with laboratory fluid data as is well known in the art. An example of EOS model tuning is described in Reyadh A. Almehaideb et al., "EOS tuning to model full field crude oil properties using multiple well fluid PVT analysis," *Journal of Petroleum Science and Engineering*, Vol. 26, Issues 1-4, pp. 291-300, 2000, incorporated herein by reference in its entirety. Corrections for drilling fluid contamination may be necessary. An example of such corrections is described in International Patent Application Publication WO 2009/138911. Upon completing the tuning/correcting of the EOS, the fluid property modeling operations of step 205 can be repeated to provide additional predictions of the properties of the reservoir fluid as needed. It is expected that the tuned/corrected EOS model will produce more accurate predictions of the properties of the reservoir fluid.

In step 211, the measurements and predictions of the fluid properties of the reservoir fluid as derived in steps 201, 205, 207, and/or 209 are evaluated to assess the need for measurements at one or more additional measurement stations and/or the need for different methodologies for repeat processing and analysis in order to improve the confidence level of the measured and/or predicted fluid properties. For example, in step 213 the measured and/or predicted properties of the reservoir fluid are compared to a database of historical reservoir data to determine the measured and/or predicted properties are consistent. If the data are inconsistent, additional measurement station(s) or different methodologies (e.g., different model(s)) can be identified for repeat processing and analysis in order to improve the confidence level of the measured and/or predicted fluid properties (step 215).

Other factors can be used to determine if there is a need for additional measurement stations and/or different methodologies for repeat processing and analysis. For example, the predictions of the EOS model are based on the assumption that the reservoir fluids within the wellbore are connected and in a state of thermodynamic equilibrium. Thus, the measured fluid properties can be accessed to confirm that they correspond to this expected architecture. More specifically, connectivity can be indicated by moderately decreasing GOR values with depth, a continuous increase of asphaltene content as a function of depth, and/or a continuous increase of fluid density and/or fluid viscosity as a function of depth. On the other hand, compartmentalization and/or non-equilibrium can be indicated by discontinuous GOR (or if lower GOR is found higher in the column), discontinuous asphaltene content (or if higher asphaltene content is found higher in the column), and/or discontinuous fluid density and/or fluid viscosity (or if higher fluid density and/or fluid viscosity is found higher in the column). In the event that the evaluation of step 211 identifies discontinuous measurements, additional measurements and analysis at or near the depths of such discontinuities can be performed to provide a clearer understanding of the location and/or reservoir structure that is causing the discontinuities (step 215).

In step 213, it is determined if the evaluation of step 211 indicates that there is a need for additional measurement stations and/or different methodologies. If so, the operations continue to step 215 for repeat processing and analysis of steps 201 to 213. For example, in the event that the evaluation of step 211 identifies discontinuous measurements, additional measurements and analysis at or near the depths of such discontinuities can be performed to provide a clearer understanding of the location and/or reservoir structure that is causing the discontinuities. If, in step 213 it is determined that the evaluation of step 211 indicates that there is no need for additional measurement stations and/or different methodologies, the operations continue to step 217.

In step 217, the measurements and predictions of the fluid properties of the reservoir fluid as derived in steps 201, 205, 207, and/or 209 are evaluated to assess reservoir properties and architecture. For example, the fluid property predictions of the EOS are based on the assumption that the reservoir fluids within the wellbore are connected and in a state of thermodynamic equilibrium. Thus, the fluid properties measured by downhole fluid analysis can be accessed to confirm that they correspond to this expected architecture. More specifically, a likelihood that the reservoir is connected and in a state of equilibrium can be indicated by moderately decreasing GOR values with depth, a continuous increase of asphaltene content as a function of depth, and/or a continuous increase of fluid density and/or fluid viscosity as a function of depth. Moreover, a likelihood that the reservoir is connected and in a state of equilibrium can be indicated by consistencies (i.e., small differences) between the fluid property predictions of the EOS model (particularly GOR, asphaltene content, fluid density, and fluid viscosity) and the corresponding downhole fluid analysis measurements.

On the other hand, a likelihood that the reservoir is compartmentalized and/or in a state of non-equilibrium can be indicated by discontinuous GOR (or if lower GOR is found higher in the column), discontinuous asphaltene content (or if higher asphaltene content is found higher in the column), and/or discontinuous fluid density and/or fluid viscosity (or if higher fluid density and/or fluid viscosity is found higher in the column). Moreover, a likelihood that the reservoir is compartmentalized and/or in a state of non-equilibrium can be indicated by inconsistencies (i.e., large differences) between the fluid property predictions of the EOS (particularly GOR, asphaltene content, fluid density, and fluid viscosity) and the corresponding downhole fluid analysis measurements.

In step 219, it is determined if the evaluation of step 217 indicates a likelihood that the reservoir is connected and in a state of equilibrium. If so, the operations continue to step 221. Otherwise, the operations continue to step 223.

In step 221, additional operations can be performed to verify that the reservoir is connected and in a state of equilibrium. For example, geological modeling of the reservoir can be carried out to provide an understanding of the petrophysical properties of the reservoir and confirm that there are no sealing barriers in the vicinity of the wellbore. Moreover, the methodology described herein can be performed over multiple wells to verify that there are no potential sealing barriers between wells Importantly, the modeling and analysis of asphaltene concentrations across the reservoir of interest, both vertically and laterally, provides valuable insight into the architecture of the reservoir. It is known that asphaltenes have very low diffusion constants in crude oils. If asphaltene concentrations are distributed in an equilibrated manner across the reservoir, both vertically and laterally, this is a strong indication for reservoir connectivety because 1) asphaltenes necessarily charge into the reservoir in a very non-equilibrated state (as compared to the final fluid distribution) and 2) substantial permeability and transmissivity is required in order to equilibrate the relatively immobile asphaltene component into the crude oil. As part of step 221, a determination that the reservoir is connected and in a state of equilibrium is reported to interested parties. Risk and uncertainty analysis can also be integrated into the workflow to associate risk and uncertainty values with this determination.

In step 223, the evaluation of step 217 has indicated a likelihood that the reservoir is compartmentalized or in a state of non-equilibrium. In order to differentiate between these two possible reservoir architectures (compartmentalized versus connected but in state of non-equilibrium), the operations utilize a model to simulate diffusion of a single component gas charge as a function of depth in the wellbore over time. The model assumes that the reservoir was charged two times—an initial charge of hydrocarbons followed by a later charge of a single gaseous component (such as methane, carbon dioxide, or hydrogen sulfide) followed. The model describes the later charge process and simulates the diffusion and transport of the single gaseous component in the initial charge of hydrocarbons as a function of location in the wellbore over time. The simulation can be carried out over a number of time steps as desired by the user.

In the preferred embodiment, the model of step 223 assumes that the reservoir fluid is a mixture that includes a number of components of the earlier charged hydrocarbons and a later charged gas component (such as methane, carbon dioxide, or hydrogen sulfide). The conservation of mass of component i in the fluid mixture can be expressed as $$\frac{\partial \rho_i}{\partial t} = \nabla(\rho_i u + J_i) + q_i, \quad (20)$$

where $\rho_i$, U, $J_i$ and $\rho_i$, are the density of component i, the average fluid velocity, the diffusive mass flux of component i, and the source/sink term of component i, respectively.

The mass density of component i in the unit hydrocarbon volume is given by:

$$\rho_i = \frac{x_i M_i \rho}{M}, \quad (21)$$

where $x_i$, $M_i$, $\rho$ and M are the mole fraction of component i, the molecular weight of component i, the fluid bulk density and the molecular weight of the fluid mixture, respectively.

Darcy's law can be used to estimate the fluid velocity as:

$$u = \frac{k}{\mu}(\rho g - \nabla P), \quad (22)$$

where k, $\mu$, g, and P are the permeability of the porous medium, the viscosity of the fluid, the gravitational acceleration, and the pressure, respectively.

The mass flux of component i can be expressed as the summation of four fluxes due to chemical, gravitational, thermal and pressure forces by the expression:

$$J_i = J_i^{Chem} + J_i^g + J_i^T + J_i^P, \quad (23)$$

$$J_i^{Chem} = x_i \rho D_i^e \sum_k \left(\frac{\delta_{ik}}{x_k} + \frac{\partial \ln \varphi_i}{\partial x_k}\right) \nabla x_k \quad (24)$$

$$J_i^g = x_i M_i \left(\frac{k}{\mu}\frac{\rho}{M} - \frac{D_i^e}{RT}\right) \rho g, \quad (25)$$

$$J_i^T = x_i \frac{M_i}{M} \rho L_{iq} \nabla T, \quad (26)$$

$$J_i^P = x_i \rho \left(\frac{k}{\mu}\frac{M_i}{M} - \frac{v_i D_i^e}{RT}\right) \nabla P, \quad (27)$$

where $D_i^e$, $\varphi$, R, T, P, and $v_i$ are the effective diffusion coefficient of component i in the fluid mixture, the fugacity coefficient of component i, the universal gas constant, the temperature, the pressure, and the molar volume of component i, respectively.

If it is assumed that the reservoir is isothermal, Eq. (23) can be rewritten as:

$$J_i = x_i \rho D_i^e \sum_k \left(\frac{\delta_{ik}}{x_k} + \frac{\partial \ln \varphi_i}{\partial x_k}\right) \nabla x_k + x_i M_i \left(\frac{k}{\mu}\frac{\rho}{M} - \frac{D_i^e}{RT}\right) \rho g - x_i \rho \left(\frac{k}{\mu}\frac{M_i}{M} - \frac{v_i D_i^e}{RT}\right) \nabla P \quad (28)$$

If it is assumed that mechanical equilibrium is achieved in the reservoir ($\nabla V = \rho g$), Eq. (28) can be rewritten as:

$$J_i = x_i \rho D_i^e \left[\sum_k \left(\frac{\delta_{ik}}{x_k} + \frac{\partial \ln \varphi_i}{\partial x_k}\right) \nabla x_k + \frac{g}{RT}(M_i - v_i \rho)\right] \quad (29)$$

If it is assumed that there is no convection (u=0), Eq. (20) becomes:

$$\frac{\partial \rho_i}{\partial t} = \nabla J_i + q_i, \quad (30)$$

This assumption is particularly useful when the reservoir has low permeability and there is weak charging intensity. Eqs. (20)-(30) can be solved to obtain the compositional gradients of the components of the reservoir fluid over to time.

In the preferred embodiment, the model of step 223 is based on Eq. (30) and thus assumes that there is no convection. Furthermore, by assuming that the reservoir fluid is an ideal solution, Eq. (29) can be rewritten as:

$$J_i = x_i \rho D_i^e \left[\frac{1}{x_i} \nabla x_i + \frac{g}{RT}(M_i - v_i \rho)\right] \quad (31)$$

The model of step 223 also preferably treats the initial charge of hydrocarbons as a mixture of a number of components in a single phase (either gas or liquid) at one depth and ignores chemical reactions between components (mixing processes are physically mixing instead of chemically mixing). Gravity, diffusion, and chemical potential forces are also accounted for by the model.

It should be noted that Eq. (31) is suitable for deriving the non-equilibrium concentration of the later charged gas component as a function of depth (in other words, the vertical concentration gradient) over time. For horizontal (lateral) concentration gradients, the gravitational contribution should be removed as follows:

$$J_i = \rho D_i^e \nabla x_i \qquad (32)$$

Therefore, Eq. (32) is reduced to Fick's diffusion law.

In the preferred embodiment, Eqs. (30)-(32) can be discretized into a set of numerical equations that are applied over computational cells with appropriate initial and boundary conditions. The unknowns of Eqs. (30)-(32) consist of the density of each component as a function of time and space (e.g., x, y, z coordinates in the event that a Cartesian grid is used). The numerical equations can be solved by numerical methods to obtain the non-equilibrium concentration (e.g., mole fractions) of the components of the reservoir fluids (including the concentration of the single phase components of the earlier charged hydrocarbons and the concentration of the later charged gas component) as a function of location in the reservoir over time. The initial conditions for the components of the earlier charged hydrocarbons can be derived from equilibrium conditions based upon the predicted compositional gradient of the reservoir fluid as calculated in steps 205 and 209 by solving Eqs. (17)-(19). The initial conditions for the components of the earlier charged hydrocarbons can also be derived from non-equilibrium conditions. Examples of initialization with non-equilibrium conditions is set forth in Gibson et al., "Non-equilibrium Initialization of Reservoir Models with Lateral and Vertical Variations in the Initial Fluid Composition," SPE 101247, presented at the 2006 Abu Dhabi International Petroleum Exhibition and Conference, Abu Dhabi, UAE., Nov. 5-8, 2006, incorporated herein by reference in its entirety. For the late gas charge component, a determination is made as to the timing and location of the late gas charge. This input is used to identify the time steps and computational grid nodes covered by the late gas charge. During these time steps, the source term q, of Eqs. (30)-(32) is set to an appropriate value. Otherwise, this source term is set to zero. Typical boundary conditions such as no external mass fluxes and fixed external mass fluxes can be used as appropriate. The numerical equations can be solved by a variety of numerical methods well know in the art, including finite difference methods, finite volume methods, and finite element methods.

It should be noted that the model of step 223 can treat the late charge as a number of gaseous components. The model of step 223 can also treat the reservoir fluids of the initial charge and the late charge as a mixture of gas and liquid components. This is particularly suited for complicated reservoirs. In this scenario, Eqs. (20) and (23) can be solved to obtain non-equilibrium concentrations of the gas and liquid components of the reservoir fluid as a function of location over time.

As part of step 223, laboratory measurements and analysis can be performed on fluid samples (and/or core samples) acquired from the reservoir of interest in steps 201 and 207 in order to identify the appropriate hydrocarbon component(s) for the model and confirm non-equilibrium concentrations of such component(s) in the reservoir fluids. For example, the reservoir fluids can be subject to appropriate isotope analysis to measure the gradient of the suitable carbon isotopes (such as the C13-C12 isotope ratio) in order to ascertain whether there is a non-equilibrium concentration of methane in the reservoir fluids. If this is the case, methane can be selected as the single component hydrocarbon for the model. Moreover, the isotope gradient can be used to constrain the compositional simulation as appropriate. Other suitable geochemistry analysis can be used to identify non-equilibrium distribution of other hydrocarbon components in the reservoir fluids.

In step 225, the concentration gradient of the hydrocarbon component(s) produced by the simulation results in step 223 is compared to the concentration gradient of such hydrocarbon component(s) as measured by downhole fluid analysis (and/or laboratory fluid analysis) in steps 201 and 207. In the preferred embodiment, the comparison is performed for simulation results of the time step whose concentration gradient is most similar to the concentration gradient of the single component hydrocarbon as measured by downhole fluid analysis (and/or laboratory fluid analysis) in steps 201 and 207.

In step 227, the differences between concentration gradient as derived from the comparison of step 225 is evaluated to determine if such differences are relatively small (e.g., satisfies a predetermined low threshold parameter) or are relatively large (e.g., satisfies a predetermined high threshold parameter). If the differences are relatively small, it is likely the reservoir is connected and in a state of non-equilibrium, and the operations continue to step 229. If the differences are relatively large, it is likely the reservoir is compartmentalized, and the operations continue to step 231.

An iterative scheme can be used that repeats steps 223 and 225 in order to minimize the difference between the concentration gradient derived by compositional simulation and the concentration gradient measured in steps 201 and 207 over successive simulation time steps. An iterative scheme that repeats steps 223, 225, and 227 for different hydrocarbon component sets can be used to minimize the differences between the concentration gradient derived by the compositional simulation and the concentration gradient measured in steps 201 and 207.

In step 229, the workflow has determined that it is likely that the reservoir is connected and in a state of non-equilibrium. Additional operations can be performed to verify that the reservoir is connected and in a state of non-equilibrium. Moreover, the methodology described herein can be performed over multiple wells to verify that there is a state of non-equilibrium across multiple wells of the reservoir. Such analysis can aid in verifying the effect of late gas charging across the lateral extent of the reservoir. As part of step 229, a determination that the reservoir is connected and in a state of non-equilibrium is reported to interested parties. Risk and uncertainty analysis can also be integrated into the workflow to associate risk and uncertainty values with this determination.

In step 231, the workflow has determined that it is likely that the reservoir is compartmentalized. Additional operations can be performed to verify that the reservoir is compartmentalized. For example, geological modeling of the reservoir can be carried out to provide an understanding of the petrophysical properties of the reservoir and confirm that there are sealing barriers in the vicinity of the wellbore. Moreover, the methodology described herein can be performed over multiple wells to verify that there are potential sealing barriers between wells Importantly, the modeling and analysis of asphaltene concentrations across the reservoir of interest, both vertically and laterally, provides valuable insight into the architecture of the reservoir. It is know that asphaltenes have very low diffusion constants in crude oils. If there are discontinuities in the distribution of asphaltene concentrations across the reservoir, both vertically and laterally, this is a strong indication for reservoir compartmentalization. As part of step 231, a determination that the reservoir is compartmentalized is reported to interested parties. Risk and uncertainty analysis can also be integrated into the workflow to associate risk and uncertainty values with this determination.

Advantageously, the present invention provides a method for determining reservoir architecture using modeling of a non-equilibrium distribution of at least one analyte in reservoir fluids. The non-equilibrium distribution of the analyte(s) is related to transport properties of reservoir fluids. The analyte(s) of the analysis preferably has (have) significant compositional variation in the reservoir. For example, the analyte can be a later charging single gas component (such as methane, carbon dioxide, and hydrogen sulfide) in a multiple component fluid system. In this case, the components in the early charge may be assumed to be in a stationary state or in equilibrium, whereas the later charge is in non-equilibrium. The non-equilibrium distribution of the analyte(s) derived from the model is compared to the distribution of the analyte(s) derived from downhole or laboratory fluid analysis, and the architecture of the reservoir (compartmentalized or connected but in a state of non-equilibrium) is determined based upon such comparison.

There has been described and illustrated herein a preferred embodiment of a method for determining reservoir architecture using modeling of a non-equilibrium distribution of at least one analyte in reservoir fluids. While particular embodiments of the invention have been described, it is not intended that the invention be limited thereto, as it is intended that the invention be as broad in scope as the art will allow and that the specification be read likewise. Thus, while particular downhole tools and analysis techniques have been disclosed for characterizing properties of the reservoir fluid and surrounding formation, it will be appreciated that other tools and analysis techniques could be used as well. Moreover, the methodology described herein is not limited to stations in the same wellbore. For example, measurements from samples from different wells can be analyzed as described herein for testing for lateral connectivity. In addition, the workflow as described herein can be modified. It will therefore be appreciated by those skilled in the art that yet other modifications could be made to the provided invention without deviating from its scope as claimed.

The invention claimed is:

1. A method for characterizing a hydrocarbon reservoir of interest traversed by at least one wellbore, the method comprising:
    (a) using a numerical model to simulate over time non-equilibrium concentration of at least one hydrocarbon component as a function of location within the wellbore; and
    (b) analyzing fluid samples acquired from at least one wellbore that traverses the reservoir of interest to measure concentration of the at least one hydrocarbon component as a function of location within the wellbore;
    (c) comparing the non-equilibrium concentration of the at least one hydrocarbon component as a function of location within the wellbore resulting from the simulation of (a) to the concentration of the least one hydrocarbon component as a function of location within the wellbore as measured in (b); and
    (d) characterizing the reservoir of interest based upon the comparing of (c).

2. A method according to claim 1, wherein the reservoir fluid within the at least one wellbore is determined to be connected and in a state of non-equilibrium in the event that there are small differences between the non-equilibrium concentration of the at least one hydrocarbon component as a function of location within the wellbore resulting from the simulation of (a) and the concentration of the at least one hydrocarbon component as a function of location within the wellbore as measured in (b).

3. A method according to claim 1, wherein the reservoir fluid within the at least one wellbore is determined to be compartmentalized in the event that there are large differences between the non-equilibrium concentration of the at least one hydrocarbon component as a function of location within the wellbore resulting from the simulation of (a) and the concentration of the at least one hydrocarbon component as a function of location within the wellbore as measured in (b).

4. A method according to claim 1, wherein the analyzing of (b) involves downhole fluid analysis performed within the wellbore on live hydrocarbon fluids extracted from the reservoir of interest.

5. A method according to claim 1, wherein the analyzing of (b) involves laboratory fluid analysis performed on at least one hydrocarbon fluid sample collected from the reservoir of interest.

6. A method according to claim 1, wherein the numerical model treats the reservoir fluid as a late gas charge into a multi-component hydrocarbon system.

7. A method according to claim 6, wherein the late gas charge includes a single gas component selected from the group consisting of methane, carbon dioxide, and hydrogen sulfide.

8. A method according to claim 6, wherein the numerical model is initialized with a non-equilibrium condition of the multi-component hydrocarbon system.

9. A method according to claim 6, wherein the numerical model is initialized with an equilibrium condition of the multi-component hydrocarbon system.

10. A method according to claim 6, wherein the numerical model is based on the assumption that the reservoir fluids are isothermal and lack convection.

11. A method according to claim 6, wherein the multi-component hydrocarbon system includes a plurality of components in a single phase.

12. A method according to claim 1, wherein:
    the numerical model is based on equations of the form $$\frac{\partial \rho_i}{\partial t} = \nabla J_i + q_i,$$

where $\rho_i$, $J_i$, and $q_i$ are the density of component i, the diffusive mass flux of component i, and the source/sink term of component i, respectively; and $$J_i = x_i \rho D_i^e \left[ \frac{1}{x_i} \nabla x_i + \frac{g}{RT}(M_i \quad v_i \rho) \right]$$

where $x_i$, $D_i^e$, $M_i$, $v_i$ are the mole fraction, effective diffusion coefficient, the molecular weight, and the molar volume of component i, respectively,
$\rho$ is the fluid bulk density of the reservoir fluid,
g is the gravitational acceleration,
R is the universal gas constant, and
T is the temperature of the reservoir fluid.

* * * * *